US012402277B2

(12) United States Patent
Kuo (10) Patent No.: US 12,402,277 B2
(45) Date of Patent: Aug. 26, 2025

(54) SYSTEM AND METHOD FOR ALL-IN-ONE COMPACT REFRIGERATION USING A LIQUID COOLING SOLUTION FOR A HARDWARE PROCESSOR

(71) Applicant: Dell Products, LP, Round Rock, TX (US)

(72) Inventor: Yu-Ming Kuo, New Taipei (TW)

(73) Assignee: DELL PRODUCTS LP, Round Rock, TX (US)

( * ) Notice: Subject to any disclaimer, the term of this patent is extended or adjusted under 35 U.S.C. 154(b) by 235 days.

(21) Appl. No.: 18/227,956

(22) Filed: Jul. 30, 2023

(65) Prior Publication Data

US 2025/0040084 A1 Jan. 30, 2025

(51) Int. Cl.
*H05K 7/20* (2006.01)
(52) U.S. Cl.
CPC ..... *H05K 7/20281* (2013.01); *H05K 7/20254* (2013.01); *H05K 7/20263* (2013.01); *H05K 7/20272* (2013.01)
(58) Field of Classification Search
CPC .......... H05K 7/20281; H05K 7/20254; H05K 7/20263; H05K 7/20272
USPC .......................................................... 361/699
See application file for complete search history.

(56) References Cited

U.S. PATENT DOCUMENTS

| 5,794,450 | A | 8/1998 | Alexander |
| 10,842,168 | B2 | 11/2020 | Jetton |
| 10,919,653 | B2 | 2/2021 | Jetton |
| 10,986,933 | B2 | 4/2021 | Youngblood |
| 11,013,338 | B2 | 5/2021 | Youngblood |
| 11,618,597 | B2 | 4/2023 | Jetton |
| 11,700,864 | B2 | 7/2023 | Jetton |
| 2008/0006037 | A1 | 1/2008 | Scott |
| 2012/0312030 | A1* | 12/2012 | Lu ........................... F25B 21/02 62/3.2 |
| 2014/0334106 | A1 | 11/2014 | Prest |
| 2017/0251709 | A1 | 9/2017 | Jetton |
| 2018/0000255 | A1 | 1/2018 | Youngblood |
| 2020/0046134 | A1 | 2/2020 | Youngblood |
| 2020/0363104 | A1* | 11/2020 | MacDonald .............. G06F 1/20 |
| 2022/0128625 | A1 | 4/2022 | Akers |
| 2022/0214730 | A1* | 7/2022 | Navarro Alvarez ........................ H05K 7/20281 |
| 2023/0025369 | A1* | 1/2023 | Subrahmanyam ........................... H05K 7/20836 |
| 2023/0112559 | A1* | 4/2023 | Gao .................... H05K 7/20781 62/3.2 |

(Continued)

*Primary Examiner* — Zhengfu J Feng
(74) *Attorney, Agent, or Firm* — Prol Intellectual Property Law, PLLC; H. Kenneth Prol (57) ABSTRACT

An information handling system includes a hardware processor, a memory device, and a PMU to provide power to the hardware processor and memory device. A TEC chip refrigeration liquid cooling system to cool a heat-generating component device includes a cold plate thermally coupled to the heat-generating component device to transfer heat from the heat-generating component device into a cold side tank thermally coupled between the cold tank and a hot side tank, a TEC chip to, when a voltage is applied to the TEC chip increase a rate of thermal transfer of heat from the cold side tank of a first liquid cooling loop to the hot side tank of a second liquid cooling loop, and a radiator thermally coupled to the hot side tank in the second liquid cooling loop to dissipate heat transferred to the radiator out of the information handling system.

20 Claims, 7 Drawing Sheets

(56) References Cited

U.S. PATENT DOCUMENTS

2025/0035346 A1* 1/2025 Nagimov .......... H05K 7/20727

* cited by examiner

SYSTEM AND METHOD FOR ALL-IN-ONE COMPACT REFRIGERATION USING A LIQUID COOLING SOLUTION FOR A HARDWARE PROCESSOR

FIELD OF THE DISCLOSURE

The present disclosure generally relates to a cooling system for an information handling system. The present disclosure more specifically relates to a liquid cooling system of an information handling system using a thermoelectric cooling chip to transfer heat from a first liquid cooling loop to a second liquid cooling loop to cool a hardware processor or other heat-generating component.

BACKGROUND

As the value and use of information continues to increase, individuals and businesses seek additional ways to process and store information. One option available to clients is information handling systems. An information handling system generally processes, compiles, stores, and/or communicates information or data for business, personal, or other purposes thereby allowing clients to take advantage of the value of the information. Because technology and information handling may vary between different clients or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific client or specific use, such as e-commerce, financial transaction processing, airline reservations, enterprise data storage, or global communications. In addition, information handling systems may include a variety of hardware and software components that may be configured to process, store, and communicate information and may include one or more computer systems, data storage systems, and networking systems. The information handling system may include telecommunication, network communication, and video communication capabilities. The information handling system may be used to execute instructions of one or more gaming applications. Further, the information handling system may include a thermal control system used to cool those heath-generating component device such as a central processing unit (CPU), a hardware processor, a graphical processing unit (GPU) and the like.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings may indicate similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Information handling systems include a number of heat-generating component devices. These heat-generating component devices may include hardware processing component devices such as a central processing unit (CPU) and a graphical processing unit (GPU) among other component devices. The CPU in particular may cause extreme thermal performance as faster CPU operations are required. For example, a temperature difference from the room temperature to an extreme performance temperature of the CPU can reach between a 9 to 20 degrees Celsius (C) while the CPU runs at 250 to 350 Watts. A thermal resistance from the package case to the ambient air may be 0.03~0.08° C./Watt. However, the existing liquid cooling systems with a 360 mm heat exchanger only provides a 0.065 C/W thermal performance. Even doubling an airflow rate of a cooling fan from 100 CFM to 200 cubic feet per minute (CFM), the thermal resistance improves by only 5% for an additional 0.003° C./Watt. Consequently, legacy liquid cooling systems in information handling systems are insufficient to overcome the cooling needs of the CPU or CPUs being developed.

The present specification describes an information handling system that includes a thermoelectric cooling chip (TEC chip) operatively coupled to a cold side tank and a hot side tank of parallel liquid cooling loop systems. The cold side tank is operatively coupled to a cold plate that is used to transmit heat from a heat generating component device (e.g., a CPU, hardware processor, GPU, battery, etc.) to the cold side tank. In an embodiment, the cold side tank may be fluidically coupled to the cold plate using a fluid tubing. This may create a first liquid cooling loop. A pump may be used to circulate the fluid through the cold plate and the cold side tank in this first liquid cooling loop. During operation, one or more TEC chips transmit heat from the cold side tank to a hot side tank by activation of the TEC chips. The TEC uses the Peltier effect to transmit the heat from the cold side tank to the hot side tank. Heat at the hot side tank may also be dissipated via use of a radiator fluidically coupled to the hot side tank. The hot side tank and radiator may form a second liquid cooling loop. In an embodiment, a second pump may circulate the heated cooling liquid from the hot side tank, through the radiator, and back again.

In an embodiment, an auxiliary radiator may be placed in fluid communication with the first liquid cooling loop. The auxiliary radiator may be placed upstream from the cold side tank such that heated cooling liquid from the cold plate may be passed through the auxiliary radiator prior to being dumped into the cold side tank 164. Thus, the auxiliary radiator may further cool the heated cooling liquid prior to being circulated into the cold side tank.

In an embodiment, the radiator and/or the auxiliary radiator may be cooled using a cooling fan and/or auxiliary fan, respectively. These cooling fans may pass air through the housing of the information handling system such that they cool their respective radiators. In another embodiment, the cold side tank may include cooling fins. The cooling fans may also pass cool air across the cooling fins coupled to the cold side tank to further reduce the temperature of the cooling liquid in the first liquid cooling loop prior to being dumped into the cold side tank. In an embodiment, a temperature sensor may be operatively coupled to the cold side tank to measure the temperature of the cooling liquid in the cold side tank. The temperature data may be passed to a hardware processor such as an embedded controller (EC) which determines whether a temperature threshold has been reached or not. Where the temperature threshold has been reached, the EC may generate instructions to activate the TEC chip thus allowing for selective activation of the TEC chip at those times where the CPU or other heat-generating component device reaches extreme temperatures.

Figure 1:
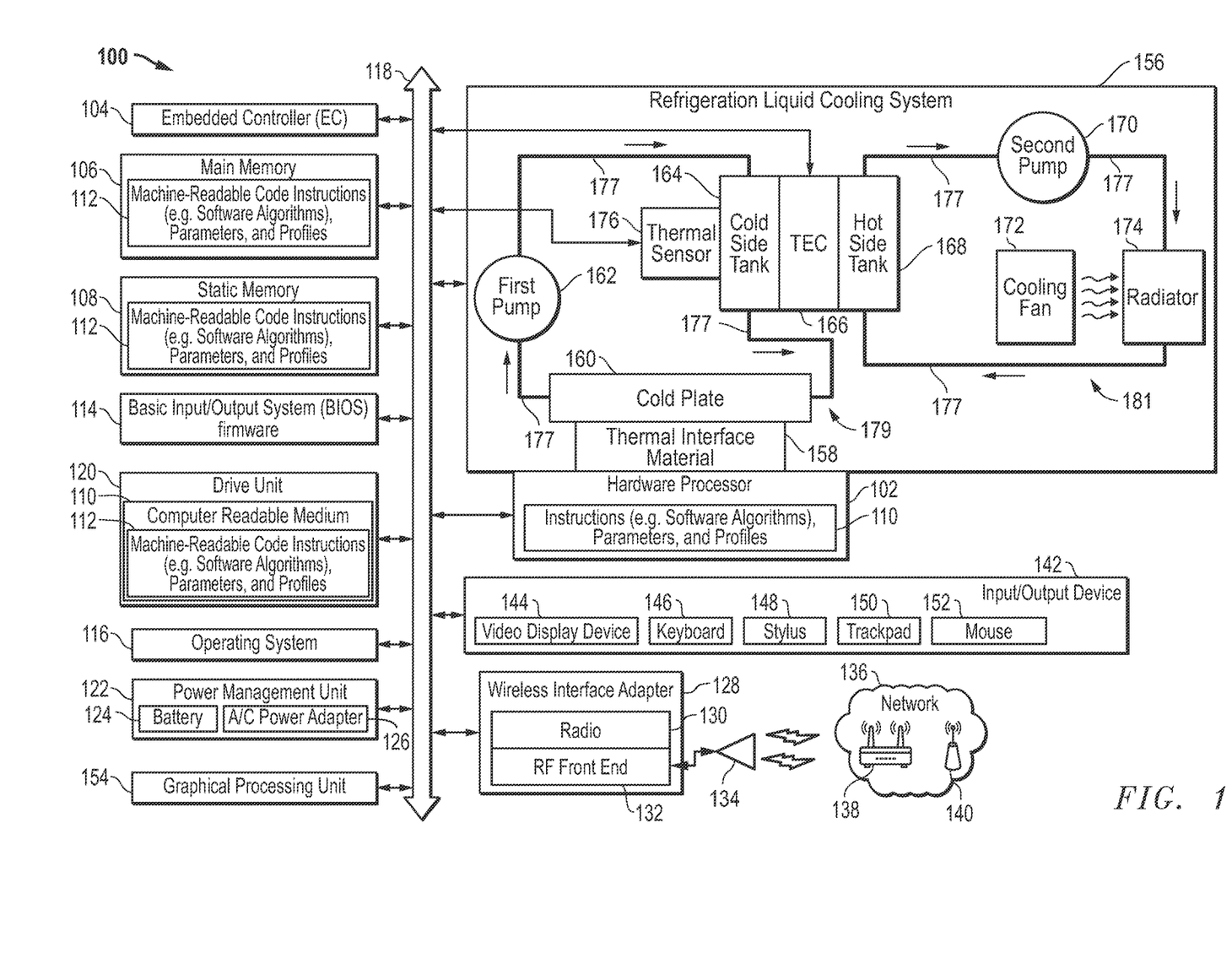
FIG. 1 is a block diagram illustrating an information handling system with a thermoelectric cooling (TEC) chip TEC chip refrigeration liquid cooling system according to an embodiment of the present disclosure.

Turning now to the figures, FIG. 1 illustrates an information handling system 100 similar to the information handling systems according to several aspects of the present disclosure. In the embodiments described herein, an information handling system 100 includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system 100 may be a personal computer, mobile device (e.g., personal digital assistant (PDA) or smart phone), server (e.g., blade server or rack server), a consumer electronic device, a network server or storage device, a network router, switch, or bridge, wireless router, or other network communication device, a network connected device (cellular telephone, tablet device, etc.), IoT computing device, wearable computing device, a set-top box (STB), a mobile information handling system, a palmtop computer, a laptop computer, a desktop computer, a communications device, an access point (AP) 138, a base station transceiver 140, a wireless telephone, a control system, a camera, a scanner, a printer, a personal trusted device, a web appliance, or any other suitable machine capable of executing a set of instructions (sequential or otherwise) that specify actions to be taken by that machine, and may vary in size, shape, performance, price, and functionality.

In a networked deployment, the information handling system 100 may operate in the capacity of a server or as a client computer in a server-client network environment, or as a peer computer system in a peer-to-peer (or distributed) network environment. In a particular embodiment, the information handling system 100 may be implemented using electronic devices that provide voice, video, or data communication. For example, an information handling system 100 may be any mobile or other computing device capable of executing a set of instructions (sequential or otherwise) that specify actions to be taken by that machine. Further, while a single information handling system 100 is illustrated, the term "system" shall also be taken to include any collection of systems or sub-systems that individually or jointly execute a set, or multiple sets, of instructions to perform one or more computer functions.

The information handling system 100 may include main memory 106, (volatile (e.g., random-access memory, etc.), or static memory 108, nonvolatile (read-only memory, flash memory etc.) or any combination thereof), one or more hardware processing resources, such as a hardware processor 102 that may be a central processing unit (CPU), a graphics processing unit (GPU) 154, hardware processor 102, embedded controller (EC) 104, or any combination thereof. Additional components of the information handling system 100 may include one or more storage devices such as static memory 108 or drive unit 120. The information handling system 100 may include or interface with one or more communications ports for communicating with external devices, as well as various input and output (I/O) devices 142, such as a keyboard 146, a trackpad 150, a mouse 152, a stylus 148, a video/graphics display device 144, or any combination thereof. Portions of an information handling system 100 may themselves be considered information handling systems 100.

Information handling system 100 may include devices or modules that embody one or more of the devices or execute instructions for one or more systems and modules. The information handling system 100 may execute instructions (e.g., software algorithms), parameters, and profiles 112 that may operate on servers or systems, remote data centers, or on-box in individual client information handling systems according to various embodiments herein. In some embodiments, it is understood any or all portions of instructions (e.g., software algorithms), parameters, and profiles 112 may operate on a plurality of information handling systems 100.

The information handling system 100 may include the hardware processor 102 such as a central processing unit (CPU). Any of the processing resources may operate to execute code that is either firmware or software code. Moreover, the information handling system 100 may include memory such as main memory 106, static memory 180, and disk drive unit 120 (volatile (e.g., random-access memory, etc.), nonvolatile memory (read-only memory, flash memory etc.) or any combination thereof or other memory with computer readable medium 110 storing instructions (e.g., software algorithms), parameters, and profiles 112 executable by the EC 104, hardware processor 102, GPU 154, or any other processing device. The information handling system 100 may also include one or more buses 118 operable to transmit communications between the various hardware components such as any combination of various I/O devices 142 as well as between hardware processors 102, an EC 104, the operating system (OS) 116, the basic input/output system (BIOS) 114, the wireless interface adapter 128, or a radio module, among other components described herein. In an embodiment, the information handling system 100 may be in wireless communication with the I/O devices 142 such as a keyboard 146, a mouse 152, video display device 144, stylus 148, or trackpad 150 among other peripheral devices.

The information handling system 100 further includes a video/graphics display device 144. The video/graphics display device 144 in an embodiment may function as a liquid crystal display (LCD), an organic light emitting diode (OLED), a flat panel display, or a solid-state display. Additionally, as described herein, the information handling system 100 may include one or more other I/O devices 142 that allow the user to interface with the information handling system 100 via the video/graphics display device 144, such as a cursor control device (e.g., the mouse 152, trackpad 150, or gesture or touch screen input), a stylus 148, and/or keyboard 146, among others. Various drivers and control electronics may be operatively coupled to operate the I/O devices 142 according to the embodiments described herein.

A network interface device of the information handling system 100 shown as wireless interface adapter 128 can provide connectivity among devices such as with Bluetooth® (e.g., 2.4 GHz) or to a network 136, e.g., a wide area network (WAN), a local area network (LAN), wireless local area network (WLAN), a wireless personal area network (WPAN), a wireless wide area network (WWAN), or other network. In an embodiment, the WAN, WWAN, LAN, and WLAN may each include an AP 138 or base station 140 used to operatively couple the information handling system 100 to a network 136. In a specific embodiment, the network 136 may include macro-cellular connections via one or more base stations 140 or a wireless AP 138 (e.g., Wi-Fi), or such as through licensed or unlicensed WWAN small cell base stations 140. Connectivity may be via wired or wireless connection. For example, wireless network wireless APs 138 or base stations 140 may be operatively connected to the information handling system 100. Wireless interface adapter 128 may include one or more radio frequency (RF) subsystems (e.g., radio 130) with transmitter/receiver circuitry, modem circuitry, one or more antenna radio frequency (RF) front end circuits 132, one or more wireless controller circuits, amplifiers, antennas 134 and other circuitry of the radio 130 such as one or more antenna ports used for wireless communications via multiple radio access technologies (RATs). The radio 130 may communicate with one or more wireless technology protocols.

In an embodiment, the wireless interface adapter 128 may operate in accordance with any wireless data communication standards. To communicate with a wireless local area network, standards including IEEE 802.11 WLAN standards (e.g., IEEE 802.11ax-2021 (Wi-Fi 6E, 6 GHz)), IEEE 802.15 WPAN standards, WWAN such as 3GPP or 3GPP2, Bluetooth® standards, or similar wireless standards may be used. Wireless interface adapter 128 may connect to any combination of macro-cellular wireless connections including 2G, 2.5G, 3G, 4G, 5G or the like from one or more service providers. Utilization of radio frequency communication bands according to several example embodiments of the present disclosure may include bands used with the WLAN standards and WWAN carriers which may operate in both licensed and unlicensed spectrums. The wireless interface adapter 128 can represent an add-in card, wireless network interface module that is integrated with a main board of the information handling system 100 or integrated with another wireless network interface capability, or any combination thereof.

In some embodiments, software, firmware, dedicated hardware implementations such as application specific integrated circuits, programmable logic arrays and other hardware devices may be constructed to implement one or more of some systems and methods described herein. Applications that may include the apparatus and systems of various embodiments may broadly include a variety of electronic and computer systems. One or more embodiments described herein may implement functions using two or more specific interconnected hardware modules or devices with related control and data signals that may be communicated between and through the modules, or as portions of an application-specific integrated circuit. Accordingly, the present system encompasses software, firmware, and hardware implementations.

In accordance with various embodiments of the present disclosure, the methods described herein may be implemented by firmware or software programs executable by a controller or a processor system. Further, in an exemplary, non-limited embodiment, implementations may include distributed processing, component/object distributed processing, and parallel processing. Alternatively, virtual computer system processing may be constructed to implement one or more of the methods or functionalities as described herein.

The present disclosure contemplates a computer-readable medium that includes instructions, parameters, and profiles 112 or receives and executes instructions, parameters, and profiles 112 responsive to a propagated signal, so that a device connected to a network 136 may communicate voice, video, or data over the network 136. Further, the instructions 112 may be transmitted or received over the network 136 via the network interface device or wireless interface adapter 128.

The information handling system 100 may include a set of instructions 112 that may be executed to cause the computer system to perform any one or more of the methods or computer-based functions disclosed herein. For example, instructions 112 may be executed by a hardware processor 102, GPU 154, EC 104 or any other hardware processing resource and may include software agents, or other aspects or components used to execute the methods and systems described herein. Various software modules comprising application instructions 112 may be coordinated by an OS 116, and/or via an application programming interface (API). An example OS 116 may include Windows®, Android®, and other OS types. Example APIs may include Win 32. Core Java API, or Android APIs.

As described herein, the information handling system includes a TEC chip refrigeration liquid cooling system 156. The TEC chip refrigeration liquid cooling system 156 may be formed and installed in a housing of the information handling system 100 and used to cool one or more heat-generating component devices within the information handling system 100. As described herein, a heat-generating component device may be any device that, through its operation, creates heat. This heat may exceed operational parameters of these heat-generating component device that may damage or destroy these component devices or degrade performance such as due to throttling. The heat-generating device may include a hardware processing device such as the hardware processor 102, a CPU, the GPU 154, or other such device. Additionally, the heat-generating component device may include other hardware within the housing of the information handing system such as a battery. Although any of these heat-generating component devices may be cooled using the TEC chip refrigeration liquid cooling system 156, the present specification describes the TEC chip refrigeration liquid cooling system 156 as cooling the hardware processor 102 for ease of description. However, it is appreciated that the TEC chip refrigeration liquid cooling system 156 may be used to cool all of these other heat-generating component devices as well as others.

The TEC chip refrigeration liquid cooling system 156 includes a cold plate 160 operatively coupled to the hardware processor 102 using a thermal interface material 158. In an embodiment, the thermal interface material 158 may be any material that transfers heat from the hardware processor 102 and into the cold plate 160. In an embodiment, the thermal interface material 158 may be a thermal paste that includes thermal conductive materials such as a polymerizable liquid matrix that includes silicone, epoxies, urethanes, and acrylates and fillers such as aluminum oxides, boron nitrides, zinc oxides, and aluminum nitrides. In an embodiment, the thermal interface material 158 may be a thermal pad. In an embodiment, the thermal interface material 158 may be a liquid metal such as gallium.

The cold plate 160 may be made of any heat conductive material such as a metal. In an embodiment, the cold plate may be made of aluminum, copper, or other heat-conductive materials. In an embodiment, the cold plate 160 may include one or more channels formed therethrough to pass a cooling liquid through the cold plate 160. In an embodiment, the channels formed through the cold plate 160 may receive a fluid tubing through which the cooling liquid can flow through. In an embodiment, the cold plate 160 may sit directly on the hardware processor 102 with the thermal interface material 158 sandwiched between the two so that heat from the hardware processor 102 is transferred or conducted into the cold plate 160. In an embodiment, the fluid tubing may also be made of a heat-transmissive material. In an embodiment, the fluid tubing may be made of copper.

The cold plate 160 may form part of a first liquid cooling loop 179 used to transfer heat from the hardware processor 102 to a cold side tank 164. In an embodiment, a first end of the channels formed through the cold plate 160 may be coupled to a fluid intake orifice of the cold side tank 164 via a fluid tubing 177 while a second end of the channels formed through the cold plate 160 is coupled to a fluid discharge orifice of the cold side tank 164 via a fluid tubing 177. This first liquid cooling loop 179 may allow cooling fluid to be passed from the cold plate 160, into the fluid intake orifice of the cold side tank 164, through the cold side tank 164, and out of the fluid discharge orifice and back into the channels formed through the cold plate 160. In an embodiment, a first pump 162 may be used to pump this cooling fluid through this first liquid cooling loop 179.

The TEC chip refrigeration liquid cooling system 156 further includes a second liquid cooling loop 181 that includes a hot side tank 168 and a radiator 174. In an embodiment, a fluid discharge orifice of the hot side tank 168 may be fluidically coupled to a fluid channel formed through the radiator 174 via a fluid tubing 177. In an embodiment, a fluid intake orifice of the hot side tank 168 may be fluidically coupled to the fluid channel formed through the radiator 174 via a fluid tubing 177. Similar to the first liquid cooling loop 179, the second liquid cooling loop 181 may include a second pump 170 used to pump the cooling liquid through the second liquid cooling loop 181 described herein. The cooling liquid, in an example embodiment, may be any liquid that can serve as a transmission medium to transmit heat from the cold plate to the cold side tank 164 and from the hot side tank 168 to the radiator 174. In an embodiment, the cooling liquid may be water, polyalkylene glycol, ethylene glycol, diethylene glycol, and propylene glycol, or a combination thereof.

In an embodiment, the TEC chip refrigeration liquid cooling system 156 may further include a cooling fan 172. The cooling fan 172 may be placed next to the radiator 174 such that, when activated via application of a voltage, passes air through the information handling system 100 and across or through orifices formed through the radiator 174 to dissipate heat from within the housing of the information handling system 100. In an embodiment, the radiator 174 may be placed next to a heat vent formed in the housing of the information handling system 100 to discharge the heated air out of the housing.

In an embodiment, the TEC chip refrigeration liquid cooling system 156 may include one or more thermoelectric cooling (TEC) chips 166. The TEC chip 166 may be placed between the cold side tank 164 and the hot side tank 168. In an embodiment, the TEC chip 166 may be any device that creates a heat flux at a junction of two different types of materials. In an embodiment, the TEC chip 166 may operate by the Peltier effect which describes the conversion of an electrical voltage into a temperature difference in the embodiments herein. Thus, via application of an electrical voltage at the TEC chip 166 heat is transmitted from a "cold" side of the TEC chip 166 to a "hot" side of the TEC chip 166. In an embodiment, the TEC chip 166 may include an array of p-type semiconductors and n-type semiconductors layered between a cathode conductor and an anode conductor. In an embodiment, the "cold" side of the TEC chip 166 is operatively coupled to the cold side tank 164 such that heat from the cold side tank 164 and the cooling liquid therein is transmitted to the "hot" side of the TEC chip 166. In an embodiment, the "hot" side of the TEC chip 166 is operatively coupled to the hot side tank 168 such that heat at the "hot" side of the TEC chip 166 is transmitted into the hot side tank 168 and the cooling liquid therein. Thus, via application of a voltage to a cathode and anode of the TEC chip 166 heat is transmitted from the first liquid cooling loop 179 to the second liquid cooling loop 181 described herein.

In an embodiment, the TEC chip refrigeration liquid cooling system 156 includes a thermal sensor 176. The thermal sensor 176 may be any type of sensor that can detect a temperature at, for example, the cold side tank 164 and transmit that temperature data to, for example, an EC 104 (e.g., via a bus 118). The temperature data may be received by the EC 104 or another controller or hardware processing resource and may be compared to a temperature threshold to determine whether the cold side tank 164 and/or the cooling liquid within the cold side tank 164 has reached that temperature threshold. Where the temperature data from the thermal sensor 176 indicates that the temperature of the cold side tank 164 and/or the cooling liquid within the cold side tank 164 exceeds a temperature threshold for activation of the TEC chip 166, the EC 104 or other hardware processing resource may send instructions to activate the TEC chip 166 and/or other cooling devices within the TEC chip refrigeration liquid cooling system 156 such as the cooling fan 172. The activation of the TEC chip or TEC chips 166 may accelerate thermal head conduction from the cold side tank 164 to the hot side tank 168 as compared to the thermal conduction between the two when no voltage is applied. Similarly, a cooling fan may accelerate heat convection from thermal fins to exhaust heat from the information handling system on either or both of the cold or warm side closed liquid cooling loops. These active cooling features may accelerate cooling during high periods of function and heat generation of a heat generating component device such as a CPU or GPU, but may come at a cost of energy.

The TEC chip refrigeration liquid cooling system 156 described herein can achieve a closed-loop sub-liquid cooling within a limited space in the housing of the information handling system. Additionally, operation of the TEC chip refrigeration liquid cooling system 156 increases thermal performance when the TEC chip 166 is activated compared to when it is not, while reducing the size of the cooling system as compared to legacy cooling systems. Still further, the TEC chip refrigeration liquid cooling system 156 enhances power efficiency by selectively activating the TEC chip 166 and/or cooling fan 172 when the temperature threshold is exceeded. Even further, the TEC chip refrigeration liquid cooling system 156 may prevent condensation from forming within the housing of the information handling system. This prevents liquid damage to the hardware and electrical components of the information handling system 100.

In an embodiment, the information handling system may include a disk drive unit 120. The disk drive unit 120 and may include machine-readable code instructions, parameters, and profiles 112 in which one or more sets of machine-readable code instructions, parameters, and profiles 112 such as firmware or software can be embedded to be executed by the hardware processor 102 or other hardware processing devices such as a GPU 154 or EC 104, or other microcontroller unit to perform the processes described herein. Similarly, main memory 106 and static memory 108 may also contain a computer-readable medium for storage of one or more sets of machine-readable code instructions, parameters, or profiles 112 described herein. The disk drive unit 120 or static memory 108 also contain space for data storage. Further, the machine-readable code instructions, parameters, and profiles 112 may embody one or more of the methods as described herein. In a particular embodiment, the machine-readable code instructions, parameters, and profiles 112 may reside completely, or at least partially, within the main memory 106, the static memory 108, and/or within the disk drive 120 during execution by the hardware processor 102, EC 104, or GPU 154 of information handling system 100.

Main memory 106 or other memory of the embodiments described herein may contain computer-readable medium (not shown), such as RAM in an example embodiment. An example of main memory 106 includes random access memory (RAM) such as static RAM (SRAM), dynamic RAM (DRAM), non-volatile RAM (NV-RAM), or the like, read only memory (ROM), another type of memory, or a combination thereof. Static memory 108 may contain computer-readable medium (not shown), such as NOR or NAND flash memory in some example embodiments. The applications and associated APIs, for example, may be stored in static memory 108 or on the disk drive unit 120 that may include access to a machine-readable code instructions, parameters, and profiles 112 such as a magnetic disk or flash memory in an example embodiment. While the computer-readable medium is shown to be a single medium, the term "computer-readable medium" includes a single medium or multiple media, such as a centralized or distributed database, and/or associated caches and servers that store one or more sets of machine-readable code instructions. The term "computer-readable medium" shall also include any medium that is capable of storing, encoding, or carrying a set of machine-readable code instructions for execution by a processor or that cause a computer system to perform any one or more of the methods or operations disclosed herein.

In an embodiment, the information handling system 100 may further include a power management unit (PMU) 122 (a.k.a. a power supply unit (PSU)). The PMU 122 may include a hardware controller and executable machine-readable code instructions to manage the power provided to the components of the information handling system 100 such as the hardware processor 102, the thermal sensor 176, the cooling fan 172, and the TEC chip 166 and other hardware components described herein. The PMU 122 may control power to one or more components including the one or more drive units 120, the hardware processor 102 (e.g., CPU), the EC 104, the GPU 154, a video/graphic display device 144, or other wired I/O devices 142 such as the stylus 148, a mouse 152, a keyboard 146, and a trackpad 150 and other components that may require power when a power button has been actuated by a user. In an embodiment, the PMU 122 may monitor power levels and be electrically coupled, either wired or wirelessly, to the information handling system 100 to provide this power and coupled to bus 118 to provide or receive data or machine-readable code instructions. The PMU 122 may regulate power from a power source such as the battery 124 or AC power adapter 126. In an embodiment, the battery 124 may be charged via the AC power adapter 126 and provide power to the components of the information handling system 100, via wired connections as applicable, or when AC power from the AC power adapter 126 is removed.

In a particular non-limiting, exemplary embodiment, the computer-readable medium can include a solid-state memory such as a memory card or other package that houses one or more non-volatile read-only memories. Further, the computer-readable medium can be a random-access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium 110 can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or machine-readable code instructions may be stored.

In other embodiments, dedicated hardware implementations such as application specific integrated circuits (ASICs), programmable logic arrays and other hardware devices can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses hardware resources executing software or firmware, as well as hardware implementations.

When referred to as a "system," a "device," a "module," a "controller," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device). The system, device, controller, or module can include hardware processing resources executing software, including firmware embedded at a device, such as an Intel® brand processor, AMD® brand processors, Qualcomm® brand processors, or other processors and chipsets, or other such hardware device capable of operating a relevant software environment of the information handling system. The system, device, controller, or module can also include a combination of the foregoing examples of hardware or hardware executing software or firmware. Note that an information handling system can include an integrated circuit or a board-level product having portions thereof that can also be any combination of hardware and hardware executing software. Devices, modules, hardware resources, or hardware controllers that are in communication with one another need not be in continuous communication with each other, unless expressly specified otherwise. In addition, devices, modules, hardware resources, and hardware controllers that are in communication with one another can communicate directly or indirectly through one or more intermediaries.

Figure 2A:
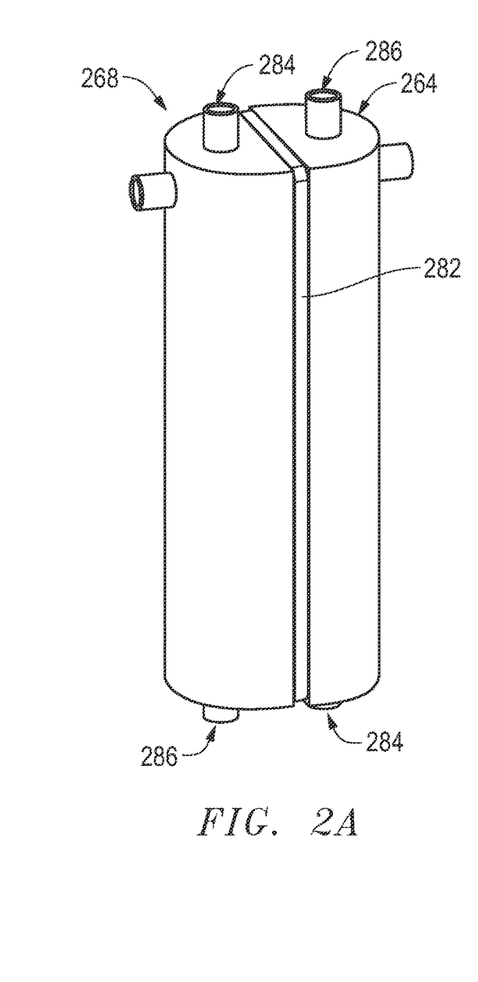
FIG. 2A is a perspective view of a cold side and hot side tank of a TEC chip TEC chip refrigeration liquid cooling system according to an embodiment of the present disclosure.
Figure 2B:
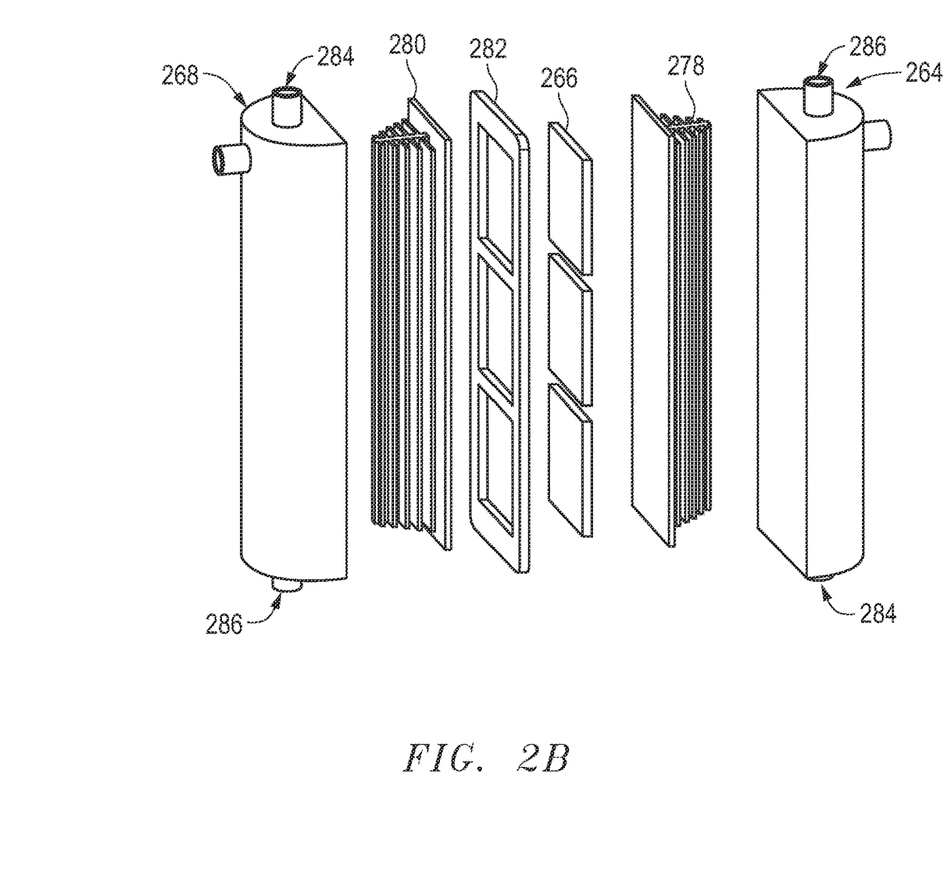
FIG. 2B is a perspective, exploded view of a cold side and hot side tank of a TEC chip refrigeration liquid cooling system according to another embodiment of the present disclosure.

FIG. 2A is a perspective view of a cold side tank 264 and hot side tank 268 of a TEC chip refrigeration liquid cooling system according to an embodiment of the present disclosure. FIG. 2A shows the hot side tank 268 and cold side tank 264 in an assembled state with the TEC chip or TEC chips (not shown) sandwiched in between the cold side tank 264 and hot side tank 268. In an embodiment, the one or more TEC chips are held in place using an isolation layer 282 to hold the one or more TEC chips in place. FIG. 2B is a perspective, exploded view of a cold side tank 264 and hot side tank 268 of a TEC chip refrigeration liquid cooling system according to another embodiment of the present disclosure. FIG. 2B shows some internal parts of the cold side tank 264 and hot side tank 268 as well as an arrangement of the TEC chip(s) 266 and isolation layer 282 in an embodiment. TEC chips 266 in FIG. 2B are shown in a planar configuration such that each of the three TEC chips 266 shown increases surface area for either active or passive thermal heat transfer between the surface of heat exchanger 278 of the hot side tank 264 and the surface of heat exchanger 280 of the cold side tank 268.

In an embodiment, the cold side tank 264 and hot side tank 268 may include a fluid intake orifice 284. The fluid intake orifice 284 may receive an amount of circulated cooling liquid into the respective tank 264, 268 so that it can help to transmit heat away from the heat-generating component device being cooled by the TEC chip refrigeration liquid cooling system described herein. In particular, the fluid intake orifice 284 at the cold side tank 264 may receive heated cooling liquid that was heated at the cold plate while the fluid intake orifice 284 of the hot side tank 268 may receive relatively cooled cooling liquid that was cooled at the radiator. Additionally, each of the tanks 264, 268 includes a fluid discharge orifice 286 to discharge cooling liquid out of the respective tanks 264, 268. In particular the fluid discharge orifice 286 of the cold side tank 264 discharges cooling liquid out of its fluid discharge orifice 286 that has been cooled via heat exchange with the hot-side tank 268 to pass the relatively cooler cooling liquid back into the cold plate. Additionally, the fluid discharge orifice 286 of the hot side tank 268 discharges cooling liquid that has been heated via passive thermal heat transfer or via activation of the TEC chip(s) 266 by voltage through a hot side cooling fluid loop. This passive or active heat exchange to the hot side cooling fluid loop than sends heated fluid towards a radiator for cooling via passive cooling there or activation of the cooling fan to exhaust head from the information handling system as described in embodiments herein.

Each of the housing of cold side tank 264 and the housing of the hot side tank 268 may include internal structures 278 and 280 respectively within used to transmit heat towards and away from the TEC chip(s) 266. In an embodiment, the cold side tank 264 includes a cold tank heat exchanger 278 with a heat exchanger surface as described above that, due to its shape, transmits heat into the TEC chip(s) 266 at the "cold" side of the TEC chip(s) 266. In an embodiment, the cold tank heat exchanger 278 may include an arranged number of successively larger fins within a fluid chamber sealed within the housing of the cold side tank 264 that helps to receive heat from the incoming cooling liquid and dump that heat onto the "cold" side of the TEC chip(s) 266. Similarly, the hot side tank 268 includes a hot tank heat exchanger 280 within a fluid chamber sealed in the housing of the hot side tank 268. The hot tank heat exchanger 280 also includes an arranged number of successively larger fins that help to discharge heat into the incoming cooling liquid from the "hot" side of the TEC chip(s) 266. This arrangement allows for the transmission of heat from the first liquid cooling loop to the second liquid cooling loop as described herein. The housing of the cold side tank 264 and the housing of hot side tank 268 may sandwich the TEC chips 266 with their respective sealed heat exchanger surfaces 278 and 280 as described and forms a compact, selectively active heat exchange interface structure between a cold side cooling liquid closed loop and parallel a hot side cooling liquid loop to accelerate removal of heat from the heat generating component device and the information handling system. This compact, selectively active heat exchange interface structure with cold side tank 264 and hot side tank 268 is both compact, controllable for heat exchange rate, and very effective at an activated state for removal of heat.

In an embodiment, the TEC chip(s) 266 may be secured in location between the cold side tank 264 and hot side tank 268 using an isolation layer 282. The isolation layer 282 may be made of an insulative material such as a rubber that prevents any condensation from accumulating at the external parts of the isolation layer 282 so that water does not form on the external parts of the isolation layer 282 causing potential damage to the electrical components within the information handling system. In the embodiment shown in FIG. 2B, for example, the isolation layer 282 is shown to hold in place three TEC chip(s) 266. The chips in the present example are in a planar array. The number and arrangement of the TEC chips 266 is merely exemplary in FIG. 2B and the present specification contemplates any number, size, and arrangement of the TEC chips 266 within the isolation layer 282. The selection of the number, size, and arrangement of the TEC chips 266 may be based on a number of factors including the maximum operating temperature of the heat-generating component device (e.g., the CPU), the dimensions of the cold side tank 264 and hot side tank 268, and the thermodynamic characteristics of the materials used to form the components of the TEC chip refrigeration liquid cooling system, among others.

Figure 3:
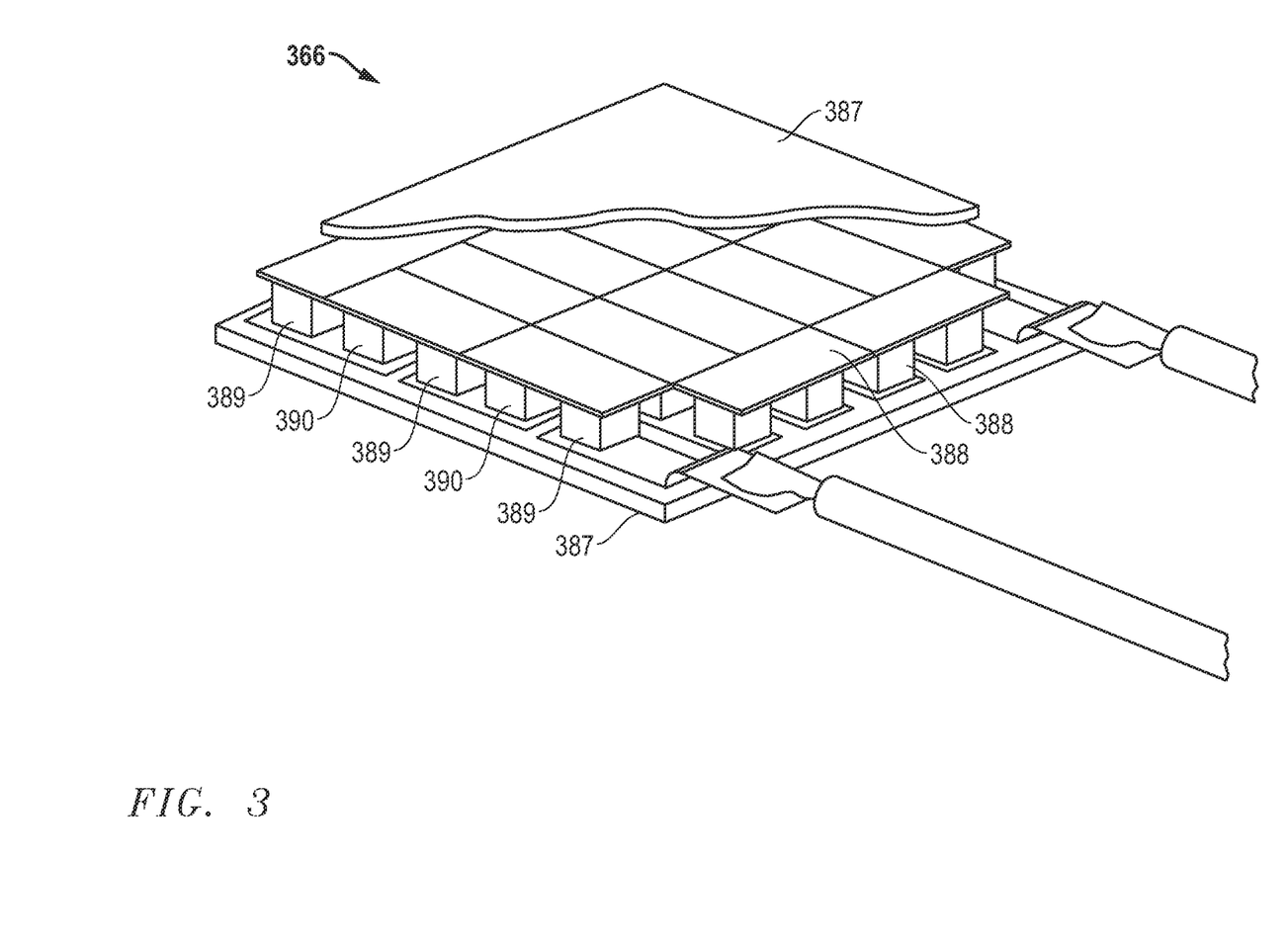
FIG. 3 is a perspective view of a TEC chip according to an embodiment of the present disclosure.

FIG. 3 is a perspective view of a TEC chip 366 according to an embodiment of the present disclosure. Although FIG. 3 shows a particular type of TEC chip 366, the present specification contemplates that the TEC chip 366 may be any type of device that can actively transmit heat from a first or "cold" side of the TEC chip 366 to a second or "hot" side of the TEC chip 366 due to application of a voltage at the TEC chip 366.

In the example embodiment shown in FIG. 3, the TEC chip 366 may include an alternating arrangement of p-type semiconductors 389 and n-type semiconductors 390. The p-type semiconductor 389 and n-type semiconductor 390 are used because they need to have different electron densities in order to operate to transmit heat. In the embodiment shown in FIG. 3, the alternating p-type semiconductors 389 and n-type semiconductors 390 are placed thermally in parallel to each other and electrically in series. In an embodiment, an electrical insulator layer 387 made of, for example, ceramic may serve to electrically insulate the components with the TEC chip 366 as well as serve as a thermal conductive medium to transmit heat from the "cold" side of the TEC chip 366 to the "hot" side of the TEC chip 366. This transfers heat from the first liquid cooling loop at the cold side tank to the second liquid cooling loop at the hot side tank in the TEC chip refrigeration liquid cooling system described herein.

During operation, when a voltage difference is applied at the cathode 391 and anode 392, there is a flow of electrical current (e.g., direct current) across a junction between the p-type semiconductor 389 and the n-type semiconductor 390. This causes a temperature difference between them allowing heat to be transmitted through the TEC chip 366. In effect, the "cold" side of the TEC chip 366 absorbs heat from the cold side tank while the "hot" side of the TEC chip 366 dissipates heat into the hot side tank. In an embodiment, the ability of the TEC chip 366 to cool the cooling liquid in the cold side tank and heat the cooling liquid in the hot side tank is proportional to the total cross section of all of the p-type semiconductors 389 and n-type semiconductors 390. In one embodiment, multiple TEC chips 366 may be stacked on each other (e.g., "hot" sides abutting "cold" sides of the TEC chips 366) such that heat may be transferred from one TEC chip 366 into another. In another embodiment, as shown above in FIG. 2B, multiple TEC chips 366 may have the "cold" sides of each TEC chip 366 arranged in a planar array and abutting or in thermal contact with the cold side tank while the opposite "hot" sides of the TEC chips 366 abut or are in thermal contact the hot side tank in such a planar arrangement.

As described herein, power to the TEC chip 366 may be provided by a battery (e.g., FIG. 1, 124) and/or an alternating current power adapter (e.g., FIG. 1, 126) under the direction of the PMU (e.g., FIG. 1, 122). The PMU may include a processing device such as a microcontroller unit (MCU) that can receive temperature data from a thermal sensor (e.g., FIG. 1, 176) on the first liquid cooling loop, compare that temperature detected at the cold side tank or elsewhere on the first liquid cooling loop to monitor heat levels generated by a heat-producing component to a threshold temperature. When that threshold temperature is exceeded, the processing device such as an MCU generates instructions to provide power to the TEC chip 366. Thus, in an embodiment, the TEC chip refrigeration liquid cooling system described herein may operate with the TEC chip 366 active or not depending on the detected temperature. This allows for the information handling system to conserve energy and operate the TEC chip 366 under those conditions where temperatures exceed the safe operational temperatures of the heat-generating component device (e.g., a CPU, a battery, a GPU, and the like).

Figure 4:
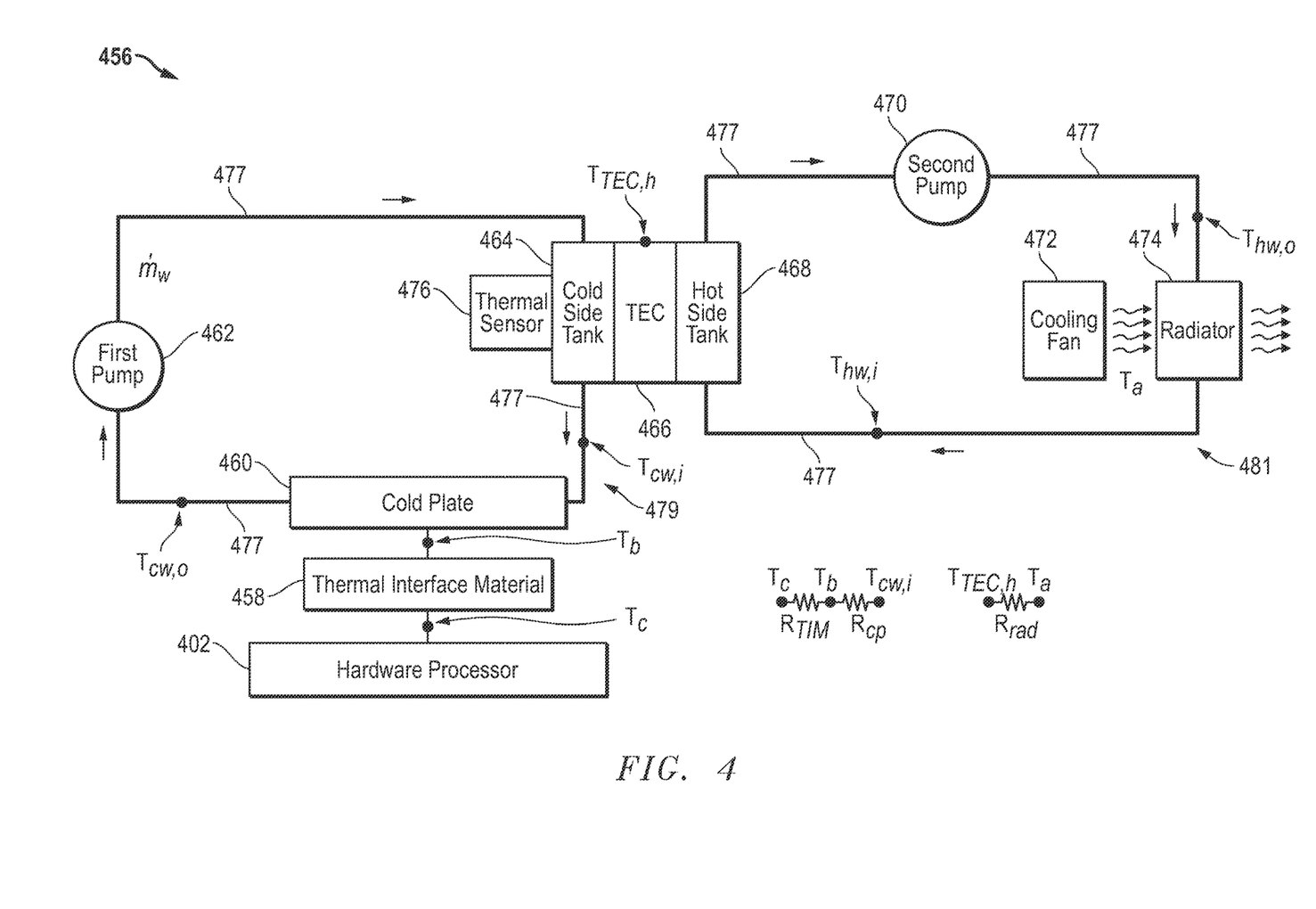
FIG. 4 is a block diagram of a TEC chip refrigeration liquid cooling system according to another embodiment of the present disclosure.

FIG. 4 is a block diagram of a TEC chip refrigeration liquid cooling system 456 according to another embodiment of the present disclosure. The TEC chip refrigeration liquid cooling system 456 shown in FIG. 4 may include similar devices as described in connection with FIG. 1. As described herein, a heat-generating component device that the TEC chip refrigeration liquid cooling system 456 operates to cool may be any device that, through its operation, creates heat. This heat may exceed operational parameters of these heat-generating component devices that may degrade performance or even damage or destroy these devices. The heat-generating component device may include a hardware processing device such as a hardware processor 402, a CPU, the GPU, or other such device. Additionally, the heat-generating component device may include other hardware components within the housing of the information handing system such as a battery or transformer. Although any of these heat-generating component devices may be cooled using the TEC chip refrigeration liquid cooling system 456, the present specification describes the TEC chip refrigeration liquid cooling system 456 as cooling the hardware processor 402 for case of description. However, it is appreciated that the TEC chip refrigeration liquid cooling system 456 may be used to cool all of these other heat-generating component devices as well as others.

The TEC chip refrigeration liquid cooling system 456 includes a cold plate 460 operatively coupled to the hardware processor 402 using a thermal interface material 458. In an embodiment, the thermal interface material 458 may be any material that transfers heat from the hardware processor 402 and into the cold plate 460. In an embodiment, the thermal interface material 458 may be a thermal paste that interfaces between the hardware processor 402 and the cold plate 460 that includes thermal conductive materials such as a polymerizable liquid matrix that includes silicone, epoxies, urethanes, and acrylates and fillers such as aluminum oxides, boron nitrides, zinc oxides, and aluminum nitrides. In an embodiment, the thermal interface material 458 may be a thermal pad. In an embodiment, the thermal interface material 458 may be a liquid metal such as gallium.

FIG. 4 also describes thermal resistances present within the TEC chip refrigeration liquid cooling system 456. There are three contributors, generally, to the TEC chip refrigeration liquid cooling system 456 resistance, namely, $R_{tim}$, $R_{cp}$, and $R_{hex}$. The $R_{tim}$ represents the thermal resistance of thermal interface material between $T_c$ and $T_h$, which is related to material properties of the thermal interface material 458. The $R_{cp}$ is the thermal resistance from the base temperature of the cold plate to the cooling liquid temperature which intakes the heat exchanger between $T_h$ and $T_{cw,i}$. The $R_{hex}$ is calculated from the cooling liquid temperature to the ambient temperature which intakes the heat exchanger or radiator 474. The TEC chip refrigeration liquid cooling system 456 may overall separate the thermal resistance into two parts: one that is $R_{tim}+R_{cp}$, and the other which is $R_{hex}$. Here, with the implementation of the TEC chip 466, which connects to the cold side tank 464 and the hot side tank 468 on the "cold" side and "hot" side of the TEC chip 466, two separated liquid cooling loops are created: a first liquid cooling loop 479 and a second liquid cooling loop 481. In FIG. 4 the $T_{cw,o}$ may be the temperature of the cooling liquid at the output of the cold plate 460. The $T_{hw,o}$ may be the temperature of the cooling liquid at a fluid discharge orifice of the hot side tank 468 while the $T_{hw,i}$ may be the temperature of the cooling liquid at a fluid intake orifice of the hot side tank 468 after being passed through the radiator 474. Ta may be a temperature at the radiator 474 at the cooling fan 472. Additionally, the $T_{TEC,h}$ is the temperature at the TEC chip 466.

Again, the cold plate 460 may be made of any heat conductive material such as a metal. In an embodiment, the cold plate may be made of aluminum, copper, or other heat-conductive materials. In an embodiment, the cold plate 460 may include one or more channels formed therethrough to pass a cooling liquid through the cold plate 460. In an embodiment, the channels formed through the cold plate 460 may receive a fluid tubing through which the cooling liquid can flow through. In an embodiment, the cold plate 460 may operatively and thermally couple to the hardware processor 402 with the thermal interface material 458 sandwiched between the two so that heat from the hardware processor 402 is transferred or conducted into the cold plate 460.

The cold plate 460 may form part of a first liquid cooling loop 479 used to transfer heat from the hardware processor 402 to a cold side tank 464. In an embodiment, a first end of the channels formed through the cold plate 460 may be coupled to a fluid intake orifice of the cold side tank 464 via a fluid tubing 477 while a second end of the channels formed through the cold plate 460 is coupled to a fluid discharge orifice of the cold side tank 464 via a fluid tubing 477. This first liquid cooling loop 479 may allow cooling fluid to be passed from the cold plate 460, into the fluid intake orifice of the cold side tank 464, through the cold side tank 464, and out of the fluid discharge orifice and back into the channels formed through the cold plate 460. In an embodiment, a first pump 462 may be used to pump this cooling fluid through this first liquid cooling loop 479.

The TEC chip refrigeration liquid cooling system 456 further includes a second liquid cooling loop 481 that includes a hot side tank 468 and a radiator 474. In an embodiment, a fluid discharge orifice of the hot side tank 468 may be fluidically coupled to a fluid channel formed through the radiator 474 via a fluid tubing 477. In an embodiment, a fluid intake orifice of the hot side tank 468 may be fluidically coupled to the fluid channel formed through the radiator 474 via a fluid tubing 477. Similar to the first liquid cooling loop 479, the second liquid cooling loop 481 may include a second pump 470 used to pump the cooling liquid through the second liquid cooling loop 481 described herein. The cooling liquid, in an example embodiment, may be any cooling liquid that can serve as a transmission medium to transmit heat from the cold plate to the cold side tank 464 and from the hot side tank 468 to the radiator 474. In an embodiment, the cooling liquid may be water, polyalkylene glycol, ethylene glycol, diethylene glycol, and propylene glycol, or a combination thereof.

In an embodiment, the TEC chip refrigeration liquid cooling system 456 may further include a cooling fan 472. The cooling fan 472 may be placed next to the radiator 474 such that, when activated via application of a voltage, passes air through the information handling system and across the radiator 474 to dissipate heat from within the housing of the information handling system.

In an embodiment, the TEC chip refrigeration liquid cooling system 456 may include one or more TEC chips 466. The TEC chips 466 may be placed between the cold side tank 464 and the hot side tank 468. In an embodiment, the TEC chips 466 may be an active device that creates additional a heat flux at a junction of two different types of materials via application of voltage. In an embodiment, the TEC chips 466 may operate by the Peltier effect which describes the conversion an electrical voltage into a temperature difference in the embodiments herein. Thus, via application of an electrical voltage at the TEC chips 466 heat is transmitted from a "cold" side of the TEC chips 466 to a "hot" side of the TEC chips 466. In an embodiment, the TEC chips 466 may include an array of p-type semiconductors and n-type semiconductors layered between a cathode conductor and an anode conductor. In an embodiment, the "cold" side of the TEC chip 466 is operatively coupled to the cold side tank 464 such that heat from the cold side tank 464 and the cooling liquid therein is transmitted to the "hot" side of the TEC chip 466. In an embodiment, the "hot" side of the TEC chip 466 is operatively coupled to the hot side tank 468 such that heat at the "hot" side of the TEC chip 466 is transmitted into the hot side tank 468 and the cooling liquid therein. Thus, via application of a voltage to a cathode and anode of the TEC chip 466 increases heat transfer that is transmitted from the first liquid cooling loop 479 to the second liquid cooling loop 481 relative to passive heat transfer from the cold side tank across to the hot side tank as described herein.

In an embodiment, the TEC chip refrigeration liquid cooling system 456 includes a thermal sensor 476. The thermal sensor 476 may be any type of sensor such as a thermocouple or other temperature sensor that can detect a temperature at, for example, the cold side tank 464 and transmit that temperature data to, for example, an EC (e.g., via a bus). The temperature data may be received by the EC and may be compared to a temperature threshold to determine whether the cold side tank 464 and/or the cooling liquid within the cold side tank 464 has reached that temperature threshold. Where the temperature data from the thermal sensor 476 indicates that the temperature of the cold side tank 464 and/or the cooling liquid within the cold side tank 464 exceeds the temperature threshold, the EC may send instructions to activate the TEC chip 466 to increase heat transfer between the first and second liquid cooling loops 479 and 481 and/or other cooling devices within the TEC chip refrigeration liquid cooling system 456 such as the cooling fan 472 to improve heat removal versus when the TEC chip 466 interface is not activated although some energy cost is incurred.

The TEC chip refrigeration liquid cooling system 456 described herein can achieve a closed-loop, high thermal exchange liquid cooling system within a limited space in the housing of the information handling system when activated. Additionally, operation of the TEC chip refrigeration liquid cooling system 456 increases thermal performance while reducing the size of the cooling system as compared to legacy cooling systems. Still further, the TEC chip refrigeration liquid cooling system 456 enhances power efficiency by selectively activating the TEC chip 466 and/or cooling fan 472 when one or more temperature threshold is exceeded thus not requiring power to the TEC chips 466 at all times. Even further, the TEC chip refrigeration liquid cooling system 456 may prevent condensation from forming within the housing of the information handling system. This prevents liquid damage to the hardware and electrical components of the information handling system.

Figure 5:
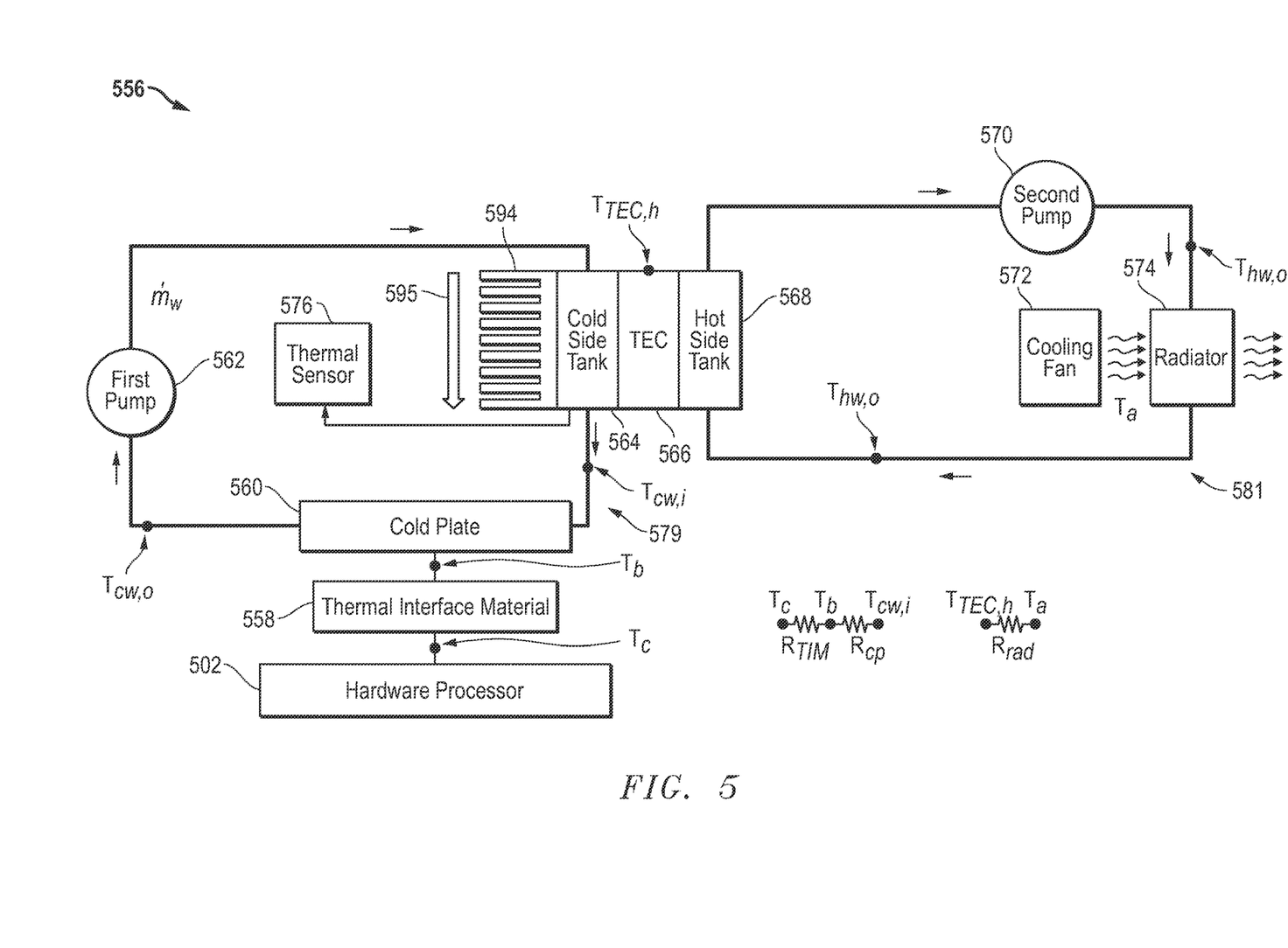
FIG. 5 is a block diagram of a TEC chip refrigeration liquid cooling system according to another embodiment of the present disclosure.

FIG. 5 is a block diagram of a TEC chip refrigeration liquid cooling system according to another embodiment of the present disclosure. The TEC chip refrigeration liquid cooling system 556 shown in FIG. 5 may include similar hardware as that described in connection with FIG. 4. In this embodiment, the first liquid cooling loop 579 includes a cold plate 560 interfacing with a hardware processor 502 via a layer of thermal interface material 558. Still further, the first liquid cooling loop 579 includes a first pump 562 that is configured to pump cooling liquid through fluid tubing 577 into and out of the cold plate 560 and cold side tank 564. A thermal sensor 576 is also operatively coupled to the cold side tank 564 to detect a temperature of the cold side tank 564 and/or the cooling liquid therein. The TEC chip refrigeration liquid cooling system 556 may also include a second liquid cooling loop 581 that includes a hot side tank 568 fluidically coupled to a second pump 570 and the radiator 574 as described herein.

In the embodiment shown in FIG. 5, a series of cooling fins 594 may be operatively coupled to the cold side tank 564. In this embodiment, the cold side tank 564 may be made of aluminum with the cooling fins 594 extending therefrom. The cooling fins 594 may passively dissipate an amount of heat from the cold side tank 564 to reduce the heat transfer needs of the TEC chip 566 formed between the cold side tank 564 and the hot side tank 568. In an embodiment, activation of the cooling fan 572 associated with the radiator 574 or another cooling fan (not shown) at the second liquid cooling loop 581 may cause an airflow to be produced throughout a housing of the information handling system. In an embodiment, the activation of the cooling fan 572 creates a cooling fin airflow 595 across the cooling fins 594 as well as through the radiator 574 thereby allowing for the cooling fan 572 to serve these two purposes of cooling the radiator 574 as well as creating this cooling fin airflow 595.

Figure 6:
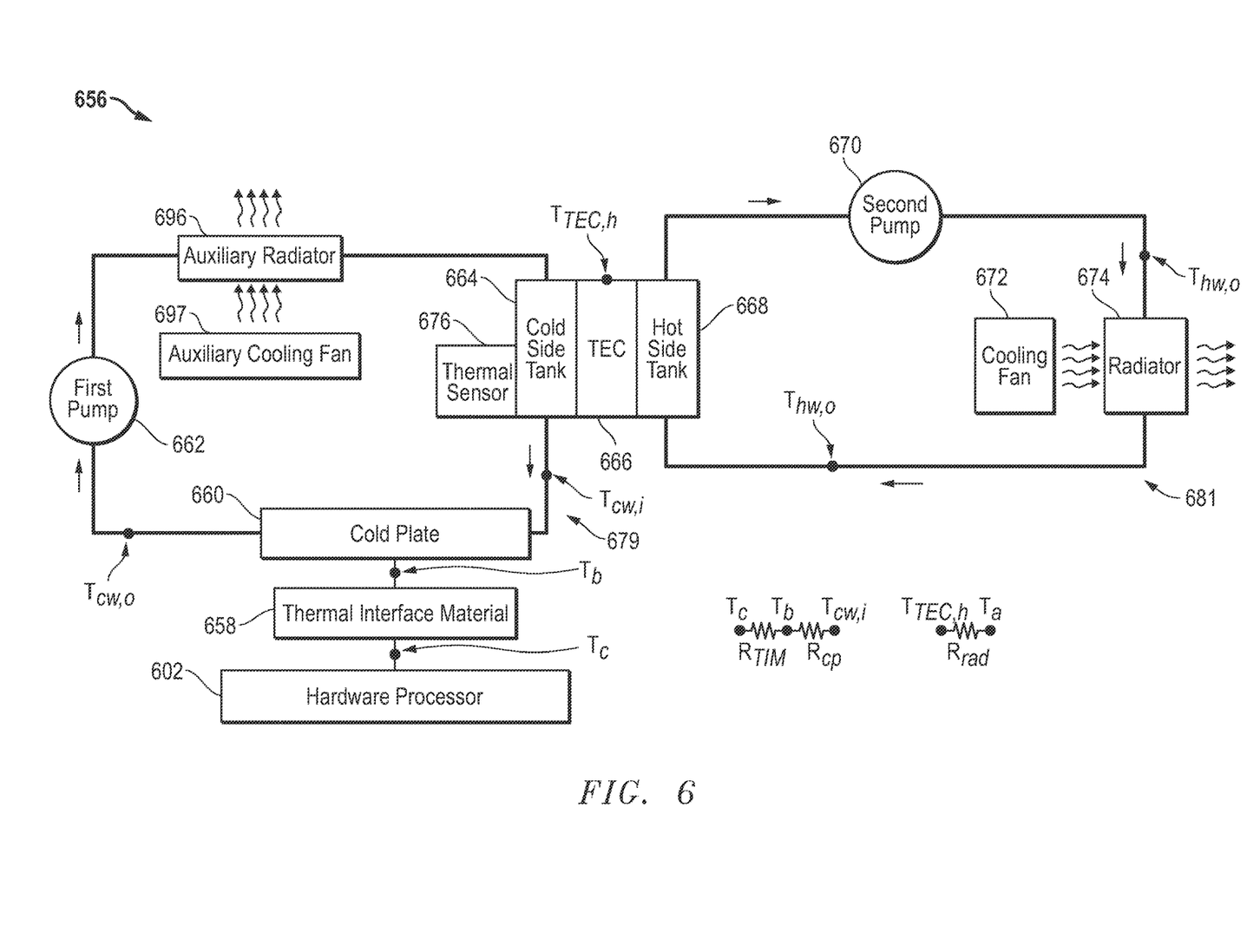
FIG. 6 is a block diagram of a TEC chip refrigeration liquid cooling system according to another embodiment of the present disclosure.

FIG. 6 is a block diagram of a TEC chip refrigeration liquid cooling system according to another embodiment of the present disclosure. The TEC chip refrigeration liquid cooling system 656 shown in FIG. 6 may include similar hardware as that described in connection with FIGS. 4 and 5. In this embodiment, the first liquid cooling loop 679 includes a cold plate 660 interfacing with a hardware processor 602 via a layer of thermal interface material 658. Still further, the first liquid cooling loop 679 includes a first pump 662 that is configured to pump cooling liquid through fluid tubing 677 into and out of the cold plate 660 and cold side tank 664. A thermal sensor 676 is also operatively coupled to the cold side tank 664 to detect a temperature of the cold side tank 664 and/or the cooling liquid therein. The TEC chip refrigeration liquid cooling system 656 may also include a second liquid cooling loop 681 that includes a hot side tank 668 fluidically coupled to a second pump 670 and the radiator 674 as described herein.

FIG. 6 also shows an auxiliary radiator 696 with an accompanying auxiliary cooling fan 697 coupled to the first liquid cooling loop 679 in an embodiment. This is in addition to the radiator 674 and cooling fan 672 operatively coupled to the second liquid cooling loop 681 as described herein. In this embodiment, the auxiliary radiator 696 and its auxiliary cooling fan 697 may provide cooling to the cooling fluid in the fluid tubing 677 so the TEC chip 666 formed between the hot side tank 668 and cold side tank 664 can be deactivated at light or medium loading on the hardware processor 602. As described herein, a thermal sensor 676 may be operatively coupled to the cold side tank 664 or at any other location including the hardware processor 602. When an EC receives this temperature data, it may reference, in an example embodiment, a temperature look-up table to compare the current temperature to one or more threshold temperatures. Where, for example, the current temperature exceeds a first threshold temperature, the EC may generate instructions to the PMU to activate the cooling fan 672, the auxiliary cooling fan 697, or both. In another example where the EC determines that a second threshold temperature has been exceeded, the EC may generate instructions to activate the TEC chip 666 in addition to the activation of the cooling fan 672 and/or auxiliary cooling fan 697. The activation of the cooling fan 672, the auxiliary cooling fan 697, and the TEC chip 666 may also depend on the ability of these devices to transmit heat out of the cooling liquid prior to or after that heat has been transmitted from the cold side tank 664 to the hot side tank 668 as described herein. Again, this allows the TEC chip refrigeration liquid cooling system 656 to selectively activate one or more of these systems in order to reduce the time that the TEC chip 666 is in operation thereby reducing the amount of power used to cool the hardware processor 602.

Figure 7:
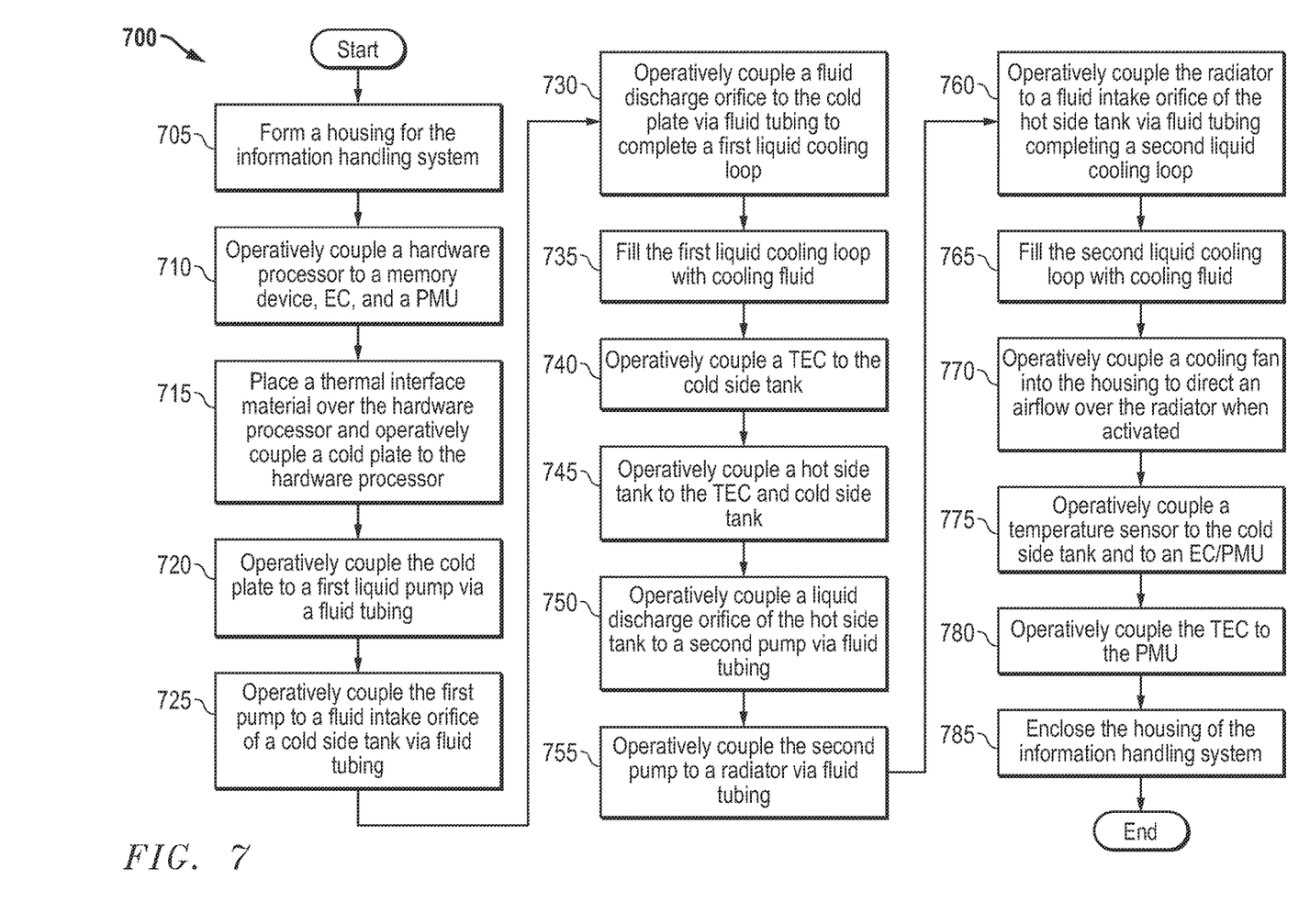
FIG. 7 is a flow diagram illustrating a method of manufacturing an information handling system including a TEC chip refrigeration liquid cooling system according to an embodiment of the present disclosure.

FIG. 7 is a flow diagram illustrating a method of manufacturing an information handling system including a TEC chip refrigeration liquid cooling system according to an embodiment of the present disclosure. The method 700 may include, at block 705, forming a housing of the information handling system. The housing of the information handling system may be in the form of a laptop-type information handling system, a desktop-type information handling system, or may take any other form to form any other type of information handling system described herein.

At block 710, the method 700 includes operatively coupling a hardware processor to a memory device and a PMU in the information handling system housing. The hardware processor and memory device may be placed on, for example, a printed circuit board (PCB) within the information handling system such as a mother board. Similarly, the PMU may be formed on the PCB or another PCB. The method 700, at block 710, may also include operatively coupling an EC to the PCB.

At block 715, the method 700 includes placing a thermal interface material over the hardware processor and operatively coupling a cold plate to the hardware processor. The cold plate may include one or more fluid channels formed therethrough to receive a cooling liquid during operation. At block 720, the method 700 further includes operatively coupling the cold plate to a first liquid pump via a fluid tubing (e.g., copper tubing). At block 725, a first pump is operatively coupled to a fluid intake orifice of a cold side tank via the fluid tubing. As described herein, the cold side tank may include a cold tank heat exchanger that, due to its shape, transmits heat into TEC chip(s) at the "cold" side of the TEC chip(s). The cold side heat exchanger may include layered sections of, for example, a conductive material (e.g., metal) that conducts heat towards a cold side of the TEC chip(s). Still further, at block 730, a fluid discharge orifice of the cold side tank is operatively coupled to the cold plate thereby forming a first liquid cooling loop as described herein. This first liquid cooling loop may be filled with a cooling fluid such as water, polyalkylene glycol, ethylene glycol, diethylene glycol, and propylene glycol, or a combination thereof at block 735.

At block 740, the method 700 includes operatively coupling one or more TEC chips to the cold side tank. In an embodiment a "cold" side of the TEC chips is operatively coupled to the cold side tank so that heat from the cold side tank may be transmitted into the TEC chips during operation. At block 745, a hot side tank is operatively coupled to the TEC chips at the "hot" side of the TEC chips. Additionally, at block 745, the hot side tank is coupled to the cold side tank using, for example an isolation layer as described herein in order to maintain the position of the TEC chips or TEC chips relative to the cold side tank and hot side tank.

At block 750, the hot side tank may be operatively coupled to a second pump via a fluid discharge orifice using a fluid tubing. At block 755, the second pump is operatively coupled to a radiator using a fluid tubing as well. At block 760, the radiator is operatively coupled to a fluid intake orifice of the hot side tank via fluid tubing. This completes a second liquid cooling loop. At block 765, the second liquid cooling loop is also filled with cooling fluid.

Having formed the first liquid cooling loop and second liquid cooling loop with the TEC chip or chips formed between the hot side tank and cold side tank, the method further includes operatively coupling a cooling fan into the housing of the information handling system with the cooling fan used to direct an airflow over the radiator when activated. As described herein, this airflow may be used to pass relatively cooler air over the radiator to cool the cooling fluid passing through the radiator.

In an embodiment, a temperature sensor may be operatively coupled to the cold side tank or other parts of the first liquid cooling loop to monitor performance in removing heat from the heat producing component device at block 775. Block 775 also includes operatively coupling the thermal sensor to the PMU, and EC or other controller managing thermal controls. The EC, during operation of the thermal sensor, may receive temperature data from the thermal sensor. The EC may direct the operation of the cooling fan and TEC chip(s) as described herein when one or more threshold temperatures are detected. During operation, the EC or other controller managing thermal controls may generate instructions to the PMU to provide power to the TEC chip(s), the cooling fan, or both to cool the cooling fluid depending on which temperature threshold is reached.

At block 780, the method includes operatively coupling the TEC chips to the PMU. Again, the EC may generate instructions to the PMU to provide power to the TEC chips in order to increase thermal transmission of heat from the cold side tank to the hot side tank. At this point, the method includes, at block 785, enclosing the housing of the information handling system. At this point, the method 700 may end.

The blocks of the flow diagrams of FIG. 7 or steps and aspects of the operation of the embodiments herein and discussed herein need not be performed in any given or specified order. It is contemplated that additional blocks, steps, or functions may be added, some blocks, steps or functions may not be performed, blocks, steps, or functions may occur contemporaneously, and blocks, steps, or functions from one flow diagram may be performed within another flow diagram.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The subject matter described herein is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents and shall not be restricted or limited by the foregoing detailed description.

What is claimed is:

1. An information handling system, comprising:
   a hardware processor;
   a memory device;
   a power management unit (PMU) to provide power to the hardware processor and memory device; and
   a thermoelectric cooling (TEC) chip refrigeration liquid cooling system to cool a heat-generating component device comprising:
      a cold plate thermally coupled to the heat-generating component device to transfer heat from the heat-generating component device into a cold side tank thermally coupled between the cold plate and a hot side tank;
      a TEC chip to, when a voltage is applied to the TEC chip increase a rate of thermal transfer of heat from the cold side tank of a first liquid cooling loop to the hot side tank of a second liquid cooling loop relative to passive heat transfer to the hot side tank; and
      a radiator thermally coupled to the hot side tank in the second liquid cooling loop to dissipate heat transferred to the radiator out of the information handling system.

2. The information handling system of claim 1 further comprising:
   a thermal sensor operatively coupled to the cold side tank to provide temperature data to an embedded controller to direct the voltage to be applied to the TEC chip when a threshold temperature at the cold side tank is detected by the thermal sensor indicating a requirement of additional heat removed from the heat-generating component device.

3. The information handling system of claim 1 further comprising:
   a first pump to circulate a fluid through the cold plate and the cold side tank fluidically coupled to each other via a fluid tubing to form the first liquid cooling loop.

4. The information handling system of claim 1 further comprising:
   a second pump to circulate a fluid through the radiator and the hot side tank fluidically coupled to each other via a fluid tubing to form the second liquid cooling loop.

5. The information handling system of claim 1 further comprising:
   a cooling fan to pass an airflow through the information handling system and past the radiator to cool heated fluid passing through the radiator and accelerate heat removal.

6. The information handling system of claim 5 further comprising:
   a heat exchanger formed within a housing of the cold side tank or the hot side tank to interface with the TEC chip and to form a compact cold side tank or hot side tank that thermally conducts heat into or out of the TEC chip, respectively.

7. The information handling system of claim 1 further comprising:
   an auxiliary radiator thermally coupled to the cold plate and cold side tank to dissipate heat transferred from the cold plate to the cold side tank prior to transferring to the cold side tank; and
   an auxiliary cooling fan to pass an airflow through the information handling system and past the auxiliary radiator to cool heated fluid passing through the auxiliary radiator.

8. A thermoelectric cooling (TEC) chip refrigeration liquid cooling system of an information handling system to cool a heat-generating component device comprising:

a cold plate thermally coupled to the heat-generating component device to transfer heat from the heat-generating component device into a cold side tank via a first liquid cooling loop;

a TEC chip thermally, coupled between the cold side tank and a hot side tank to, when a voltage is applied to the TEC chip via a power management unit via instructions from a hardware controller, accelerate a transfer of heat from the cold side tank of the first liquid cooling loop to the hot side tank of a second liquid cooling loop relative to passive transfer of heat to the hot side tank; and a radiator thermally coupled to the hot side tank via the second liquid cooling loop to dissipate heat transferred to the radiator out of the information handling system.

9. The TEC chip refrigeration liquid cooling system of claim 8 further comprising:

a thermal sensor operatively coupled to the cold side tank to provide temperature data to the embedded controller to direct the voltage to be applied to the TEC chip when a threshold temperature at the cold side tank is detected by the thermal sensor.

10. The TEC chip refrigeration liquid cooling system of claim 8 further comprising:

a first pump to circulate a fluid through the cold plate and the cold side tank fluidically coupled to each other via a fluid tubing in the first liquid cooling loop.

11. The TEC chip refrigeration liquid cooling system of claim 8 further comprising:

a second pump to circulate a fluid through the radiator and the hot side tank fluidically coupled to each other via a fluid tubing in the second liquid cooling loop.

12. The TEC chip refrigeration liquid cooling system of claim 8 further comprising:

a cooling fan to pass an airflow through the information handling system and past the radiator to cool heated fluid passing through the radiator.

13. The TEC chip refrigeration liquid cooling system of claim 8 further comprising:

cooling fins thermally coupled to the cold side tank to transfer heat away from the cold side tank.

14. The TEC chip refrigeration liquid cooling system of claim 12 further comprising:

a planar array of TEC chips thermally coupled between the cold side tank and the hot side tank and electrically coupled to the power management unit.

15. An information handling system, comprising:

a hardware processor;

an embedded controller;

a memory device;

a power management unit (PMU) to provide power to the hardware processor and memory device; and a thermoelectric cooling (TEC) chip refrigeration liquid cooling system to cool a heat-generating component device that is the hardware processor comprising:

a first liquid cooling loop formed by a cold plate operatively coupled to a cold side tank via fluid tubing;

a second liquid cooling loop formed by a radiator operatively coupled to a hot side tank via fluid tubing; and a TEC chip operatively coupled to the PMU to, when a voltage is applied to the TEC chip, transfer heat from the cold side tank to the hot side tank, where the TEC chip is disposed between the cold side tank and the hot side tank.

16. The information handling system of claim 15 further comprising:

a thermal sensor operatively coupled to the first liquid cooling loop to monitor temperature data of heat generated by the heat-generating component device; and an embedded controller to direct the voltage to be applied to the TEC chip when a threshold temperature at the first liquid cooling loop is detected by the thermal sensor.

17. The information handling system of claim 15 further comprising:

a first pump to circulate a fluid through the cold plate and the cold side tank fluidically coupled to each other via the fluid tubing and a second pump to circulate a fluid through the radiator and the hot side tank fluidically coupled to each other via the fluid tubing.

18. The information handling system of claim 15 further comprising:

a planar array of TEC chips thermally coupled between the cold side tank and the hot side tank.

19. The information handling system of claim 15 further comprising:

a cooling fan to pass an airflow through the information handling system and past the radiator to cool heated fluid passing through the radiator; and cooling fins thermally coupled to the cold side tank to transfer heat away from the cold side tank.

20. The information handling system of claim 15 further comprising:

a first heat exchanger formed within a housing of the cold side tank and a second heat exchange formed within the housing of the hot side tank to form a compact cold side tank and hot side tank that thermally conducts heat into and out of the TEC chip.

* * * * *